(12) United States Patent
Pouttu et al.

(10) Patent No.: US 10,707,777 B2
(45) Date of Patent: Jul. 7, 2020

(54) CONTROL OF PARALLEL CONNECTED POWER DEVICES

(71) Applicant: Vacon Oy, Vaasa (FI)

(72) Inventors: Jussi Pouttu, Vaasa (FI); Ari Ristimäki, Laihia (FI); Toni Itkonen, Vaasa (FI)

(73) Assignee: Vacon Oy, Vaasa (FI)

( * ) Notice: Subject to any disclaimer, the term of this patent is extended or adjusted under 35 U.S.C. 154(b) by 0 days.

(21) Appl. No.: 15/763,153

(22) PCT Filed: Sep. 27, 2016

(86) PCT No.: PCT/EP2016/072952
§ 371 (c)(1),
(2) Date: Mar. 26, 2018

(87) PCT Pub. No.: WO2017/060125
PCT Pub. Date: Apr. 13, 2017

(65) Prior Publication Data
US 2018/0269805 A1    Sep. 20, 2018

(30) Foreign Application Priority Data
Oct. 9, 2015    (FI) .................................... 20155709

(51) Int. Cl.
| | |
|---|---|
| *H02M 7/493* | (2007.01) |
| *H03K 17/12* | (2006.01) |
| *H02M 5/458* | (2006.01) |
(Continued)

(52) U.S. Cl.
CPC ......... *H02M 7/493* (2013.01); *H02M 5/4585* (2013.01); *H02M 7/5387* (2013.01);
(Continued)

(58) Field of Classification Search
CPC .............. H02M 7/493; H02M 7/5387; H02M 7/53873; H02M 5/4585; H02M 5/458; H03K 17/12; H02P 27/06
See application file for complete search history.

(56) References Cited

U.S. PATENT DOCUMENTS

| | | | | |
|---|---|---|---|---|
| 7,778,045 B2 * | 8/2010 | Alexander | .......... | H02M 3/1582 363/13 |
| 8,188,694 B2 | 5/2012 | Tallam et al. | | |
(Continued)

FOREIGN PATENT DOCUMENTS

| | | |
|---|---|---|
| CN | 1799186 A | 7/2006 |
| EP | 0524398 A2 | 1/1993 |
(Continued)

OTHER PUBLICATIONS

International Search Report for Serial No. PCT/EP2016/072952 dated Dec. 14, 2016.

*Primary Examiner* — Adolf D Berhane
*Assistant Examiner* — Kevin H Sprenger
(74) *Attorney, Agent, or Firm* — McCormick, Paulding & Huber PLLC

(57) ABSTRACT

A method and arrangement for controlling semiconductor power switches, e.g. IGBTs, in parallel connected power devices, e.g. in frequency converters, wherein the semiconductor power switches connect either the positive or the negative pole of the intermediate DC-voltage of the power device to an output phase of the power device. In the method the voltages of those output phases which are connected in parallel are measured, the timing differences of the output voltage state changes are calculated on the basis of the output voltage measurement results, and the control signals of the semiconductor power switches are advanced or delayed such that the output voltage state changes in the (Continued)

phases which are connected together via output impedances occur at desired time instants.

23 Claims, 2 Drawing Sheets

(51) Int. Cl.
*H02M 7/5387* (2007.01)
*H02P 27/06* (2006.01)

(52) U.S. Cl.
CPC ........... *H03K 17/127* (2013.01); *H02M 5/458* (2013.01); *H02M 7/53873* (2013.01); *H02P 27/06* (2013.01)

(56) References Cited

U.S. PATENT DOCUMENTS

| | | | |
|---|---|---|---|
| 8,432,714 B2 | 4/2013 | Keronen et al. | |
| 9,887,616 B2 * | 2/2018 | Bai | H02M 3/33507 |
| 2004/0262057 A1 | 12/2004 | Kumar | |
| 2008/0013351 A1 * | 1/2008 | Alexander | H02M 3/1582 |
| | | | 363/123 |
| 2008/0055940 A1 * | 3/2008 | Lawson | H02M 3/158 |
| | | | 363/16 |
| 2014/0204643 A1 | 7/2014 | Wagoner et al. | |
| 2014/0346998 A1 * | 11/2014 | Kleinodt | H02M 5/458 |
| | | | 318/757 |
| 2016/0197600 A1 * | 7/2016 | Kuznetsov | H03K 3/45 |
| | | | 307/106 |

FOREIGN PATENT DOCUMENTS

| | | |
|---|---|---|
| EP | 1892822 A2 | 2/2008 |
| EP | 2445110 A1 | 4/2012 |
| EP | 2876797 A2 | 5/2015 |
| EP | 2884661 A1 | 6/2015 |

* cited by examiner

CONTROL OF PARALLEL CONNECTED POWER DEVICES

CROSS-REFERENCE TO RELATED APPLICATIONS

This application is a National Stage application of International Patent Application No. PCT/EP2016/072952, filed on Sep. 27, 2016, which claims priority to Fininsh Patent Application No. 20155709, filed on Oct. 9, 2015, each of which is hereby incorporated by reference in its entirety.

TECHNICAL FIELD

The present invention relates to a method and arrangement for controlling parallel connected power devices. More particularly, the invention is related to balance the loads of parallel-connected inverters by controlling the switching moments of power semiconductor switches of parallel-connected inverters.

BACKGROUND ART

Parallel connection of electric power devices, e.g. frequency converters, is required at very high output power level (e.g. >1 MW) due to limitations of commercial switch type power components like IGBT modules. The parallel connection may be implemented either inside a single unit by connecting several power components in parallel or connecting larger similar units in parallel. The parallel connection inside a single unit is problematic because each different power level requires its own mechanical construction. That is why normally entire power units are connected in parallel, which is advantageous also from manufacturing and service point of view. The parallel connection of power units requires normally also use of external balancing impedances, e.g. inductors, between the output terminals and common point of coupling.

Insulated gate bipolar transistors (IGBT) are switch-type power electronic components which are widely used in the main circuits of power electronic devices, like in frequency converters. IGBT is a gate controlled component, which means that it can be switched on/off by a voltage signal supplied to the gate terminal. IGBT is an ideal component for power electronic applications due to a fast response time to the gate control signal, thus making it possible to keep the load current under precise control.

In the following, IGBT is used as an example of the power semiconductor switch, but as is clear for a person skilled in the art, there exist other type of power semiconductor components, too, whereto the present invention can be applied.

The load performance (i.e. current loadability) of parallel connected power units is normally lower than the performance sum of single devices, due to that the load current does not necessarily share equally between the devices. That is why it is normal to use a derating factor, e.g. 0.9 which means that $$P_{sum} = 0.9 \times \Sigma P_N \quad [1]$$

where $P_{sum}$ is the sum output power of the parallel connected units and $P_N$ is the nominal output power of each single unit.

A derating factor means a decrease to the theoretical maximum power, being thus a problem e.g. in economic terms. It is advantageous to be able to use as high a derating factor as possible, which is possible by balancing the loads as precisely as possible.

There are many known methods for the balancing, e.g. the patent publication U.S. Pat. No. 8,188,694 B2 presents a solution, wherein a common control unit calculates the timing of output voltage state change instances and sends this timing signal to the control units of each parallel connected inverters. The inverter-specific control units then form the control signals of power stage IGBT's essentially simultaneously. Simultaneous switching moments boost equal load share, but in this method and arrangement the signal delay tolerances of the components in the signal path may cause deviation from the ideal situation and demand to use a derating factor and great output impedances. In the patent publication U.S. Pat. No. 8,432,714 a solution is presented, wherein the load balancing between the parallel connected inverter modules is based on adjusting the switching instructions of switch components according to the measured output currents and measured inverter module temperatures.

SUMMARY

The object of the present invention is to avoid the problems of prior art by presenting a novel solution for parallel connected power devices, e.g. frequency converters, enabling controlled, advantageously essentially simultaneous, timing of output voltage pulse waveforms. The objective is achieved by what is stated in the independent claims, other preferred embodiments are disclosed in the dependent claims.

The characteristic feature of the present invention is that the output voltages of all the parallel connected power devices, e.g. frequency converters, are measured and the measuring results are used for mitigating timing differences during output voltage state changes caused e.g. by gate driver circuit and switching component parameter tolerances. In praxis this means that the control signals of the parallel operating IGBTs are advanced or delayed such that the timing of the output voltage pulse state changes occur as desired. In one embodiment of the invention the timing is desired to be essentially simultaneous, but according to the invention it is also possible to set timing differences, e.g. in order to compensate the effect of load impedance imbalances.

According to an embodiment of the invention, the criterion used for determining the output voltage timing is the voltage time integral over a predefined period, e.g. after the reference voltage state change (this timing has been used as example in the figures).

According to an embodiment of the invention, the criterion used for determining the output voltage timing is the time instant or duration when the output voltage passes one voltage level (e.g. the middle of the DC intermediate voltage level) or several voltage levels (e.g. 10% and 90% of the DC intermediate voltage levels) after the reference voltage state change.

According to an embodiment of the invention the output voltages are measured and the compensation of the signal handling path delay differences according to the measurement results is executed continuously during the operation of the device. Thus by this method the effects of e.g. temperature, current level, aging etc. to the output voltage state change timings will automatically be taken into account and compensated. In this document this is called as the dynamic form of implementation. A condition for this implementation form is that the power device or the arrangement comprises means for measuring the output voltages. The operating principle of the measuring means may be analogous or digital (i.e. comparing the output voltage to one or several predefined levels).

According to an embodiment of the invention the nature of the measurement of output voltages is non-recurring, i.e. they are measured only during the manufacturing process or during commissioning, and the IGBT-specific compensation advances or delays, calculated according to the detected timing differences, are stored as parameters in the control unit of the device. These delay compensation parameters, which may be determined and stored as a function of one or several load conditions, are then used during the operation of the device until the possible next parameter determination occurrence. In this document this is called as the static form of implementation. This static form of implementation is possible either by using internal measurement means or by using external measurement means, e.g. an oscilloscope. By this method the possible changes in output voltage state change timings will not be compensated during the device operation.

The present invention is beneficial over the prior art technology in that the signal handling delay differences in the entire control signal path are compensated continuously in all environmental and load conditions. Thus the output voltage state changes occur as desired, advantageously essentially simultaneously, which makes it possible to maximize the derating factor and minimize the external balancing impedances e.g. such that they may consist just of pieces of cables.

The invention is defined in more detail in the present description and the following examples of embodiments. The scope of protection is defined in the independent claims and the preferred embodiments in other claims.

BRIEF DESCRIPTION OF THE FIGURES

Below the invention appears a more detailed explanation using examples with references to the enclosed figures, wherein.

DETAILED DESCRIPTION

Figure 1:
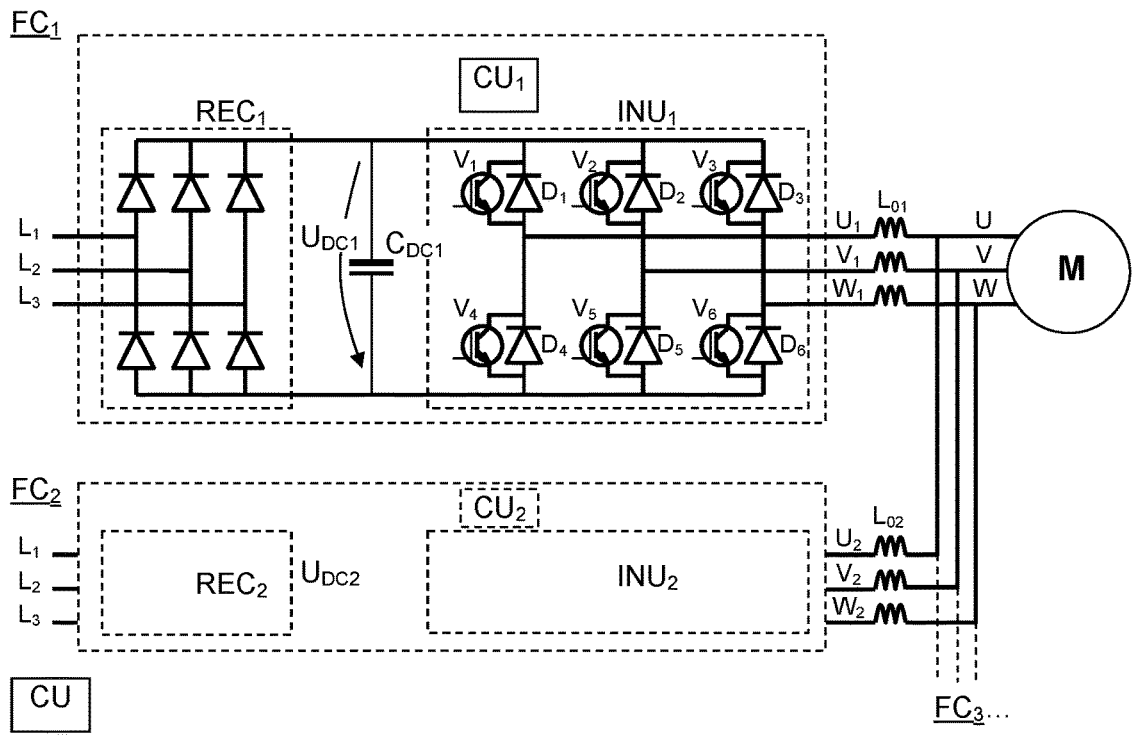
FIG. 1 presents a main circuit of parallel connected frequency converters.

FIG. 1 presents a main diagram of parallel connected frequency converters as an example of power device arrangement wherein the method according to the present invention may be applied. In the arrangement, frequency converters $FC_1$ and $FC_2$ are connected in parallel via output three-phase inductors $L_{O1}$ and $L_{O2}$ for supplying a common motor M. The main function of the output inductors is to improve load current sharing during the switching instants. The number of parallel connected devices in this and the following exemplary figures is for simplicity two, but this is not any limitation for the present invention, more similar devices $FC_3 \ldots$ may be connected in the same arrangement as well.

In the example the main circuit of $FC_1$ is presented in detail. It is a known and typical frequency converter, containing a diode-bridge rectifier $REC_1$ which rectifies the three-phase supply voltage $L_1$, $L_2$, $L_3$ into a constant intermediate DC-link voltage $U_{DC1}$ which is smoothed by a capacitor $C_{DC1}$, a three-phase inverter unit $INU_1$, consisting of IGBT-switches $V_1 \ldots V_6$ with antiparallel free-wheeling diodes $D_1 \ldots D_6$, and a control unit $CU_1$. An inductive component is normally used in either side of the rectifier in order to filter the harmonics of the supply phase current, but as an irrelevant component from the present invention point of view it has been left out from the figure. The basic function of the inverter is to create a three-phase adjustable output voltage $U_1$, $V_1$, $W_1$ for the motor M. This type of a device is known as two-level converter, due to two poles of the DC-link voltage. As is apparent to a person skilled in the art, the present invention is not limited only for two-level converters, but it can be applied also to higher voltage level converters.

Figure 2:
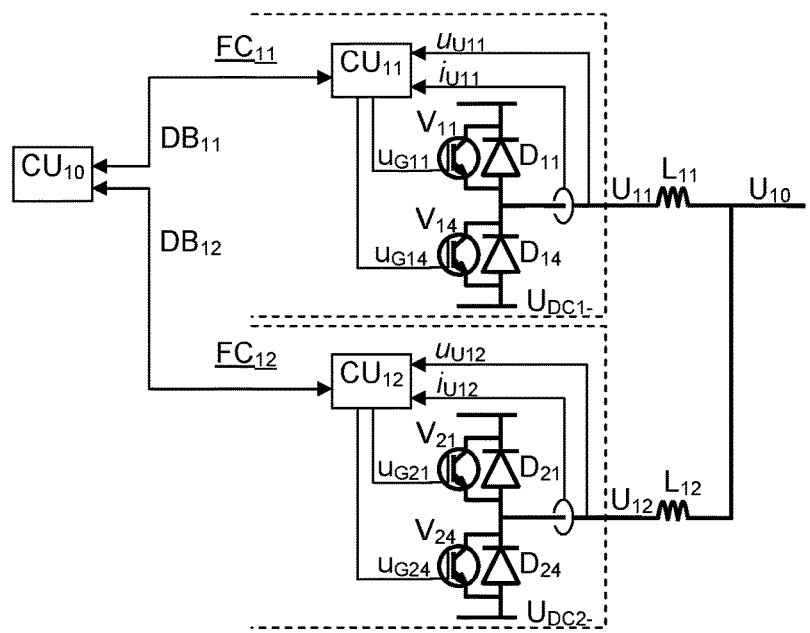
FIG. 2 presents a main circuit of parallel connected phase switches.

The parallel connected another frequency converter $FC_2$ is presented in a block diagram level. Each frequency converter may be complete and have own units as presented in the figure, or they may have e.g. a common rectifier and common intermediate circuit. All parallel connected devices have a common control unit CU, which is in fast data transfer connection with frequency converter—specific control units $CU_1$, $CU_2 \ldots$ FIG. 2 presents an example of an arrangement for connecting phase switches of parallel connected inverter units $FC_{11}$, $FC_{12}$ in parallel. A phase switch means components that are able to connect the output phase terminal either of DC-link pole. E.g. in $FC_{11}$ the IGBTs $V_{11}$, $V_{14}$ and free-wheeling diodes $D_{11}$, $D_{14}$ belong to the U-phase switch. The output terminals $U_{11}$, $U_{12}$ of the parallel connected phases are connected via inductive filters $L_{11}$, $L_{12}$ to the common output terminal $U_{10}$.

In the example the inverter units have internal means for measuring the output phase currents ($i_{U11}$, $i_{U12}$) and the output phase voltages ($u_{U11}$, $u_{U12}$). The output voltage is normally measured against the negative pole of the DC-link voltage ($U_{DC1-}$, $U_{DC2-}$), and according to the present invention it may be measured just by one or several comparators in order to find out the exact moment of time when the output voltage passes a predefined voltage level (levels), or it may be measured by an analog circuit in order to find out the time integral of the voltage wave shape. It is worth to note that though the direct output voltage measurement has been referred to in descriptive examples, the output voltages may be measured also indirectly by measuring the voltages across each IGBT. The internal output phase voltage measurement means is absolutely required only in case of dynamic implementation of the present invention, the static case may be realized also by external measurement means. $CU_{11}$, $CU_{12}$ are symbolizing inverter specific control units, which receive the measurement information, generates the gate control pulses ($u_{G11}$, $u_{G14}$, $u_{G21}$, $u_{G24}$) for the IGBTs and communicates via the communication links $DB_{11}$, $DB_{12}$ with a common control unit $CU_{10}$, which in this exemplary topology calculates the modulation pattern (=position references for the phase switches). In praxis the control units $CU_{11}$, $CU_{12}$ may comprise several separate subunits, like a control board for signal handling and a gate driver for gate control pulse generation.

Figure 3A:
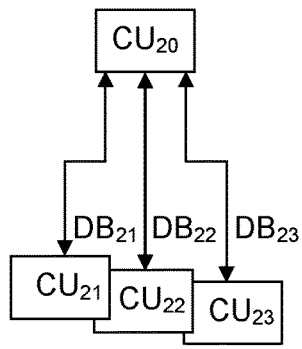
FIGS. 3A-3C present control data transfer topologies in a parallel connection.
Figure 3B:
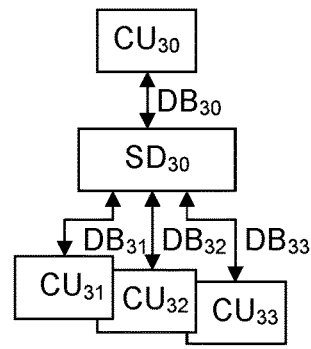
Figure 3C:
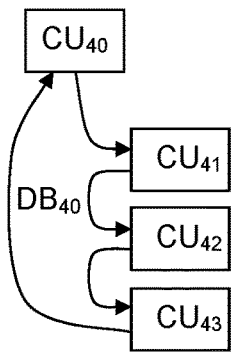

FIG. 3A-3C present some examples of communication topologies that may be used for connecting electrical devices, like frequency converters, in parallel according to the present invention.

FIG. 3A presents a topology wherein the main control unit $CU_{20}$ communicates directly via data bus communication links $DB_{21}$, $DB_{22}$, $DB_{23}$ with inverter specific control units $CU_{21}$, $CU_{22}$, $CU_{23}$. In this arrangement the control units $CU_{21}$, $CU_{22}$, $CU_{23}$ send their measurement data to $CU_{20}$, which calculates the modulation patterns and sends them to each inverter specific control units $CU_{21}$, $CU_{22}$, $CU_{23}$. The individual modulation patterns are calculated either according to the measurements in dynamic implementation case or according to the stored delay difference compensating parameters in static implementation case.

FIG. 3B presents a topology, wherein a signal division unit $SD_{30}$ is added between the main control unit $CU_{30}$ and the inverter specific control units $CU_{31}$, $CU_{32}$, $CU_{33}$. In this case the main control unit is physically the same in spite of the number of parallel connected units, and it calculates a basic modulation pattern. The time delay advances or delays to the inverter specific pulse patterns can be calculated in $SD_{30}$ either according to the measurement data it receives from inverters via data buses $DB_{31}$, $DB_{32}$, $DB_{33}$ or according to the stored delay difference compensating parameters.

FIG. 3C presents a ring topology, wherein the same communication link $DB_{40}$ connects the main control unit $CU_{40}$ with all control units $CU_{41}$, $CU_{42}$, $CU_{43}$ of parallel connected inverters. In this arrangement each control unit $CU_{41}$, $CU_{42}$, $CU_{43}$ sends by turns their own measurement data to the main control unit, which then calculates and sends individual modulation patterns to each inverter specific control unit.

Figure 4:
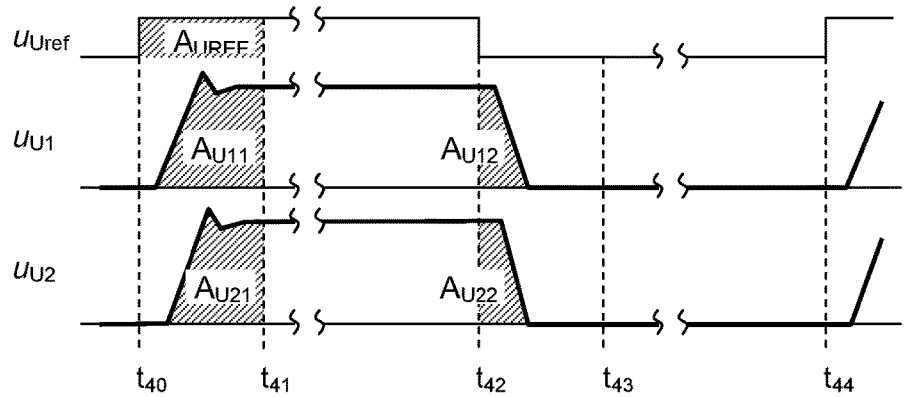
FIG. 4 illustrates output voltages in a parallel connection.

FIG. 4 illustrates the principle according to an embodiment of the present invention on how the asynchronous switching of parallel connected electric devices, like frequency converters, is determined. Here $u_{Uref}$ is the basic reference signal, i.e. the position reference for both U phase switches when no timing difference compensation is applied, and $u_{U1}$, $u_{U2}$ are the corresponding output voltages of two parallel connected U phase switches. According to an embodiment of the present invention, virtual switching time delays of both phase switches are determined, and if they differ from each other the difference will be compensated in the following similar state changes by advancing or delaying the control pulses of the parallel connected IGBTs. In praxis this means that either the position reference of the faster phase switch (i.e. phase switch having shorter virtual switching time delay) is delayed compared to that of the slower one, or the position reference of the slower phase switch is advanced, respectively. It is also possible to set controlled timing differences to the output voltage state changes, e.g. in order to compensate the effect of load impedance imbalances to equal load current sharing. In this case timing differences can be set in such a way that the output voltage state changes of different outputs occur at different time instants.

The determination of the virtual switching time delay can be based on the difference between the time integrals of an ideal phase voltage (with no switching delay) and the real measured output voltage. E.g. in the exemplifying FIG. 4 for phase U11 the ideal voltage integral $A_{UREF}$, the real voltage integral $A_{U11}$ and the virtual switching time delay $t_{vU11}$ after an upward state change can be calculated according to the following formulas [2] . . . [4]:

$$A_{UREF} = \int_{t_{40}}^{t_{41}} U_{DC1} \times dt \quad [2]$$

$$A_{U11} = \int_{t_{40}}^{t_{41}} u_{U1} \times dt \quad [3]$$

$$t_{vU11} = \frac{A_{UREF} - A_{U11}}{A_{UREF}} \times (t_{41} - t_{40}) \quad [4]$$

In this example the voltage time integrals are calculated over a predefined period, advantageously from the reference signal change moment $t_{40}$ until a time instant $t_{41}$, where the U11 phase voltage has reached the final DC intermediate link level $U_{DC1}$ and voltage transients after the state change have been settled down.

The virtual switching time delay $t_{vU21}$ of the output phase U21 will be calculated in a similar way on the basis of corresponding time integral $A_{U21}$, and according to the present invention the possible difference between virtual delays $t_{vU11}$ and $t_{vU21}$ will be compensated during the next similar output phase state change after time instant $t_{44}$.

A similar determination of virtual switching time delays can be executed also after the opposite position change ($t_{42}$-$t_{43}$). It is possible to use different integration times from what is presented in FIG. 4, e.g. by calculating the time integral until the next opposite position change instant (from $t_{40}$ to $t_{42}$) or even to the next similar position change instant (from $t_{40}$ to $t_{44}$).

Figure 5:
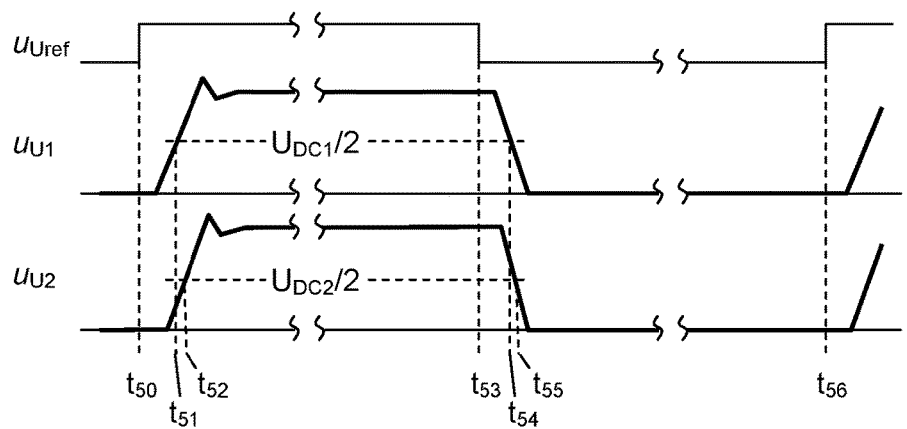
FIG. 5 illustrates output voltages in a parallel connection.

FIG. 5 illustrates another method for determining the time difference between the output voltage state changes. In this case the output voltage is compared to a predetermined level, e.g. to the middle of the DC-link voltage ($U_{DC1}/2$ and $U_{DC2}/2$). The different time instants in passing these voltage levels ($t_{51}$-$t_{52}$ at upward voltage pulse, $t_{54}$-$t_{55}$ at downward voltage pulse) can directly be used as the correction time advance/delay for the next similar situation. It is also possible to use more than one level for the voltage comparison in order to gain a more accurate result, e.g. 10%, 50% and 90% of DC-link voltage, and optionally also use the average or weighted average of the comparison results for timing difference correction.

As a final result of the output phase voltage state change advancing/delaying process according to the present invention, all parallel connected output phases will change their states essentially simultaneously.

According to the dynamic embodiment of the invention, the output voltages are measured and the compensation of the signal handling path delay differences is executed essentially continuously during the operation of the device.

According to the static embodiment of the invention, the nature of the measurement of output voltages is non-recurring, i.e. they are measured e.g. only during the manufacturing process or during commissioning, and the IGBT-specific compensation advances or delays, calculated according to the detected output voltage differences, are stored as parameters in the control unit of the device. This embodiment may be implemented e.g. so that all state changes of output voltages are adjusted to occur after a constant delay period from the state changes of phase switch position reference signals. The delay parameters may be determined and stored as a function of one or several load conditions.

While the invention has been described with reference to the previous embodiments, it should be recognized that the invention is not limited to these embodiments, but many modifications and variations will become apparent to persons skilled in the art without departing from the scope of the invention, as defined in the appended claims. E.g., though the direct output voltage measurement has been referred to in descriptive examples, the output voltages may be measured also indirectly by measuring the voltages across each IGBT.

What is claimed is:

1. A method for controlling semiconductor power switches in parallel connected power devices,
   wherein the semiconductor power switches of each of parallel connected power devices connect either the positive or the negative pole of the intermediate DC-voltage of respective power device to an output phase of the power device,
   wherein at least one output phase of each power device of the parallel connected power devices is connected to a common output terminal such that the common output terminal is connected to at least two output phases,
   wherein the method comprises the steps of:
   measuring the voltages of output phases, which are connected in parallel, for the parallel connected power devices,
   calculating timing differences of output voltage state changes on the basis of the measured output voltages of at least two power devices of the parallel connected power devices, the calculating of the timing differences includes comparing a timing of each measured output voltage of the output phases for determining differences in timing of the output voltages of the output phases connected in parallel, and
   advancing or delaying the control signals of the semiconductor power switches on the basis of the calculated timing differences such that the output voltage state changes in the phases which are connected together via output impedances occur at desired time instants.

2. The method according to claim 1,
   wherein the control signals of the semiconductor power switches are advanced or delayed such that the output voltage state changes in the phases which are connected together via output impedances occur essentially simultaneously.

3. The method according to claim 1,
   wherein the control signal of the faster phase switch is delayed compared to the control signal of the slower one, and/or the control signal of the slower phase switch is advanced compared to the control signal of the faster one.

4. The method according to claim 1,
   wherein:
   the waveforms of the output voltages of those output phases which are connected in parallel are measured, and
   the time integrals of the output voltages over a predefined period are calculated for output phases which are connected in parallel, and
   the differences of calculated time integrals in the phases which are connected together via output impedances are used as criterions for determining output voltage timing differences.

5. The method according to claim 4,
   wherein the time integrals of the output voltages over a predefined period are calculated such that the integral calculation for each phase starts before or at the output voltage state change occurrence.

6. The method according to claim 1,
   wherein:
   the waveforms of the output voltages of those output phases which are connected in parallel are measured, and the time instants when the output voltages pass one or several predefined voltage levels are determined,
   the differences of determined time instants when passing of comparable voltage levels in the phases which are connected together via output impedances are used as criterions for determining output voltage timing differences.

7. The method according claim 1,
   wherein the output voltage timing difference calculation is executed essentially continuously during the operation of the power device.

8. The method according to claim 1,
   wherein the determined output voltage timing differences are stored as parameters in the control unit of the power device.

9. The method according to claim 8,
   wherein the output voltage timing difference calculation is executed during the manufacturing process and/or during commissioning.

10. The method according to claim 1,
    wherein each of the parallel connected power devices is an inverter.

11. An arrangement for controlling semiconductor power switches in parallel connected power devices,
    wherein the semiconductor power switches of each parallel connected power devices are arranged to connect either the positive or the negative pole of the intermediate DC-voltage of respective power device to an output phase of the power device,
    wherein at least one output phase of each power device of the parallel connected power devices is connected to a common output terminal such that the common output terminal is connected to at least two output phases,
    wherein:
    the arrangement is arranged to measure the voltages of output phases, which are connected in parallel, for the parallel connected power devices,
    to calculate the timing differences of output voltage state changes on the basis of the measured output voltages of at least two power devices of the parallel connected power devices, the calculating of the timing differences includes comparing a timing of each measured output voltage of the output phases for determining differences in timing of the output voltages of the output phases connected in parallel, and
    to advance or delay the control signals of the semiconductor power switches on the basis of the calculated timing differences such that the output voltage state changes in the phases which are connected together via output impedances occur as desired time instants.

12. The arrangement according to claim 11, wherein the arrangement is configured to advance or delay the control signals of the semiconductor power switches such that the output voltage state changes in the phases which are connected together via output impedances occur essentially simultaneously.

13. The arrangement according to claim 11,
    wherein the arrangement is arranged to delay the control signal of the faster phase switch compared to the control signal of the slower one, and/or advance the control signal of the slower phase switch compared to the control signal of the faster one.

14. The arrangement according to claim 11,
    wherein:
    the arrangement is arranged to measure the waveforms of the output voltages of those output phases which are connected in parallel, and to calculate the time integrals of the output voltages over a predefined period for output phases which are connected in parallel, and to use the differences of calculated time integrals in the phases which are connected together via output impedances as criterions for determining output voltage timing differences.

15. The arrangement according to claim 11, wherein the arrangement is arranged to calculate the time integrals of the output voltages over a predefined period such that the integral calculation for each phase starts before or at the output voltage state change occurrence.

16. The arrangement according to claim 11, wherein:

the arrangement is arranged to measure the waveforms of the output voltages of those output phases which are connected in parallel, to determine the time instants when the output voltages pass one or several predefined voltage levels, and to use the differences of determined time instants when passing of comparable voltage levels in the phases which are connected together via output impedances as criterions for determining output voltage timing differences.

17. The arrangement according to claim 11, wherein the arrangement is arranged to execute the output voltage timing difference calculation essentially continuously during the operation of the power device.

18. The arrangement according to claim 11, wherein the arrangement comprises storing means to which the arrangement is arranged to store the output voltage timing differences as parameters.

19. The arrangement according to claim 18, wherein the output voltage timing difference calculation is executed during the manufacturing process and/or during commissioning.

20. The arrangement according to claim 11, wherein the arrangement comprises means for measuring the output phase currents.

21. The arrangement according to claim 20, wherein the means for measuring the output phase currents are internal means.

22. The arrangement according to claim 20, wherein the means for measuring the output phase currents are external means.

23. The arrangement according to claim 11, wherein each of the parallel connected power devices is an inverter.

* * * * *